(12) United States Patent
Essex

(10) Patent No.: US 7,276,699 B2
(45) Date of Patent: Oct. 2, 2007

(54) ABSORPTANCE ENHANCING COATING FOR MWIR DETECTORS

(75) Inventor: Douglas M. Essex, Elgin, IL (US)

(73) Assignee: Northrop Grumman Corporation, Los Angeles, CA (US)

( * ) Notice: Subject to any disclaimer, the term of this patent is extended or adjusted under 35 U.S.C. 154(b) by 130 days.

(21) Appl. No.: 11/131,886

(22) Filed: May 18, 2005

(65) Prior Publication Data

US 2006/0261273 A1 Nov. 23, 2006

(51) Int. Cl.
*G01J 5/20* (2006.01)
*G01J 5/02* (2006.01)
*H01L 27/146* (2006.01)

(52) U.S. Cl. .............. 250/338.4; 250/370.13; 250/353

(58) Field of Classification Search ......... 250/338.4, 250/370.13, 353
See application file for complete search history.

(56) References Cited

U.S. PATENT DOCUMENTS

| | | | |
|---|---|---|---|
| 4,229,066 A | 10/1980 | Rancourt et al. | |
| 4,282,290 A | 8/1981 | Pellicori et al. | |
| 4,684,812 A | 8/1987 | Tew et al. | |
| 4,756,602 A | 7/1988 | Southwell et al. | |
| 4,956,555 A | 9/1990 | Woodberry | |
| 5,072,109 A | 12/1991 | Aguilera, Jr. et al. | |
| 5,144,138 A | 9/1992 | Kinch et al. | |
| 5,164,858 A | 11/1992 | Aguilera, Jr. et al. | |
| 5,525,828 A * | 6/1996 | Bassous et al. | 257/457 |
| 5,552,603 A | 9/1996 | Stokes | |
| 5,726,805 A | 3/1998 | Kaushik et al. | |
| 6,023,063 A | 2/2000 | Norton | |
| 6,222,111 B1 | 4/2001 | Kern | |
| 6,301,042 B1 | 10/2001 | Pelekhaty | |
| 6,452,187 B1 | 9/2002 | Claiborne et al. | |
| 6,590,710 B2 | 7/2003 | Hara et al. | |
| 6,657,194 B2 | 12/2003 | Ashokan et al. | |
| 2004/0108461 A1 | 6/2004 | Mitra | |
| 2004/0159805 A1* | 8/2004 | Boutet et al. | 250/586 |

* cited by examiner

*Primary Examiner*—David Porta
*Assistant Examiner*—Mindy Vu
(74) *Attorney, Agent, or Firm*—Stetina Brunda Garred & Brucker

(57) ABSTRACT

Provided is an infrared radiation detector comprising an active layer having a front side and a back side. An anti-reflective coating is disposed on the front side and is configured to minimize reflection of incident light within a wavelength band of interest upon the front side. A highly-reflective coating is disposed on the backside and is configured to increase reflection within the wavelength band of interest upon the back side. Each one of the anti-reflective coating and highly-reflective coatings are comprised of a quarterwave stack of a plurality of layers each having an optical thickness equal to one-fourth of the wavelength band of interest. The wavelength band of interest is preferably in the range of from about 3.0 to about 5.0 microns.

18 Claims, 7 Drawing Sheets

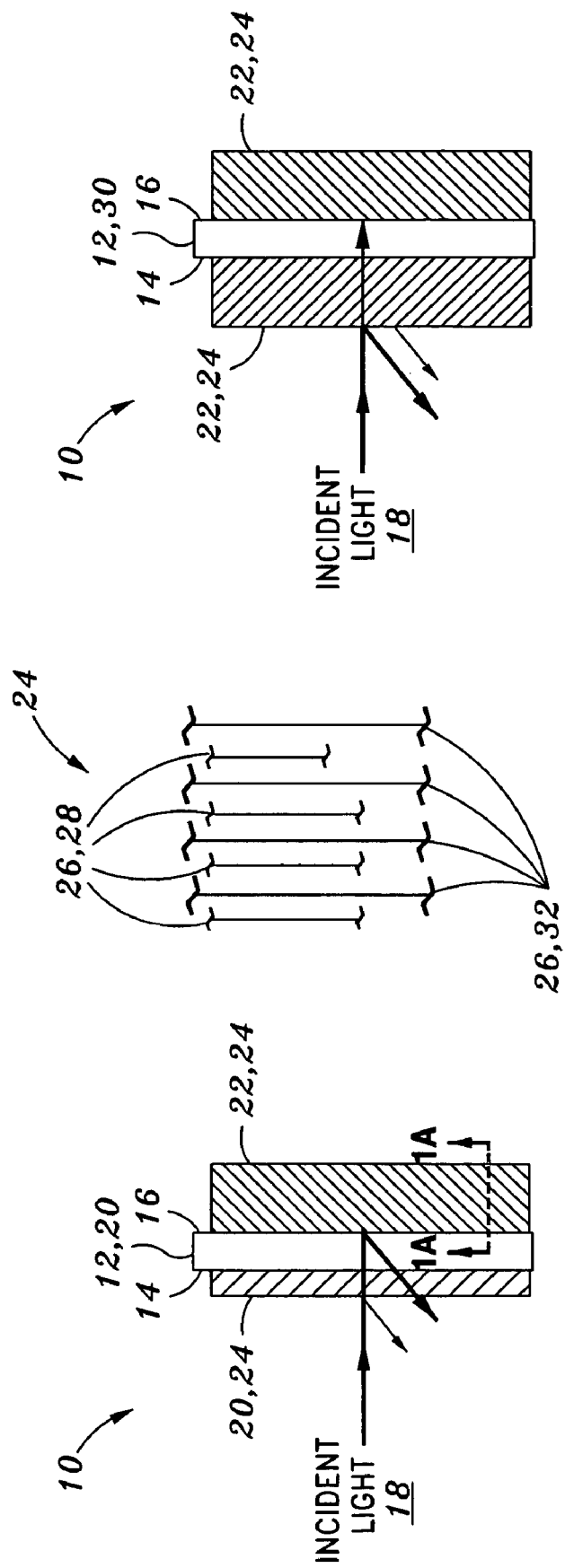

ABSORPTANCE ENHANCING COATING FOR MWIR DETECTORS

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

The present invention relates in general to radiation detectors and, more particularly, to a uniquely configured infrared radiation detector having improved performance due in part to the use of coatings which are specifically adapted to enhance absorptability of a wavelength band of interest of incident light within an active layer of the detector while minimizing noise produced during radiation detection.

In the field of infrared (IR) imaging, the objective is to produce thermal images which allows for the observation and/or detection of scenes during conditions of limited visibility such as at night and/or through clouds, smoke and dust. In certain military applications, it is desirable for the radiation detector to operate in the middle wavelength IR (MWIR) band corresponding to a wavelength band ranging from about 3 microns to about 5 microns. Such MWIR detectors allow for thermal imaging of airplanes, artillery tanks and other objects having a similar thermal signature. In addition, MWIR detectors may be used in low power applications such as in night vision for surveillance of personnel.

The installation of such MWIR detectors in military applications in many instances necessitates that such detectors are capable of performing in a high temperature environment. In order to simplify their construction and operation, it is desirable that such MWIR detectors operate without the need for complicated cooling equipment such as cryogenic cooling. An additional requirement for many military applications is that the MWIR detector include the capability for spectral selectivity in order to increase the probability of detection of objects in their various environments. More specifically, by configuring the MWIR detector to have spectral selectivity, certain objects having a known IR radiation emission band may be readily detected. In this manner, the performance goals of the MWIR detector are enhanced which, in turn, enhances military capability.

BRIEF SUMMARY OF THE INVENTION present invention specifically address the above referenced needs associated with infrared radiation detectors. More specifically, the present invention is an infrared radiation detector comprising an active layer having a front side and a back side with coatings disposed on the front side and back side. Absorptability within the active layer is enhanced by the application of such coatings. Furthermore, optimization of the coatings allows for spectral selectivity such that the infrared radiation detector may readily detect objects emitting infrared radiation of a known wavelength.

In a first embodiment of the infrared radiation detector, the active layer includes an anti-reflective coating disposed on the front side and a highly-reflective coating disposed on the back side. In the first embodiment, incident light is antireflected upon impinging the front side of the active layer with the back side of the active layer serving as a mirror such that the incident light is double-passed through the active layer in order to increase absorptance therewithin. The active layer is preferably formed of a compound having the formula $Hg_{0.30}Cd_{0.70}Te$ which is hereinafter referred to as 30% material. The anti-reflective coating on the front side minimizes reflection of incident light within a wavelength band of interest upon the front side. The anti-reflective coating is comprised at a quarterwave stack of three layers each having an optical thickness equal to one-fourth of the wavelength band of interest.

The highly-reflective coating is disposed on the back side and is configured to increase reflection within the wavelength band of interest upon the back side. The highly-reflective coating is comprised of a quarterwave stack of a plurality of layers each having an optical thickness equivalent to one-fourth of the wavelength band of interest, similar to the composition of the anti-reflective coating on the front side. The anti-reflective coating is preferably fabricated of layers alternating between material formed of Cadmium-Telluride and material formed of a compound having the formula $Hg_{0.30}Cd_{0.65}Te$ which is hereinafter referred to as 35% material. It is contemplated that the quarterwave stack comprising the highly-reflective coating may include 20 or 30 layers of the highly-reflective coating.

The infrared radiation detector of the second embodiment comprises the active layer having the highly-reflective coating disposed on both the front and back sides. Furthermore, the infrared radiation detector of the second embodiment may be placed in the cavity of a Fabry-Perot etalon (i.e., filter) in order to enhance spectral selectivity. In this regard, specific wavelength bands may be selectively passed through the front side of the active layer. However, although the response is narrowband for the second embodiment, the application of the highly-reflective coating on the front side increases reflection of incident light falling outside the wavelength band of interest while minimizing reflection of incident light falling within the wavelength band of interest.

Therefore, by including the highly-reflective coating on both the front and back side in the second embodiment, absorptance into the active layer may be increased up to about 4½ times the absorptance that is achievable in the first embodiment. The thickness of the active layer in the second embodiment may be increased in order to improve the absorptance into the active layer. However, the highly-reflective coatings on the front side and on the back side must be re-optimized to match the new thickness of the active layer.

BRIEF DESCRIPTION OF THE DRAWINGS

These as well as other features of the present invention will become more apparent upon reference to the drawings wherein:

FIG. 1 is a cross-sectional view of an infrared (IR) radiation detector of the present invention in a first embodiment illustrating an active layer having an anti-reflective (AR) coating disposed on a front side of the active layer and a highly-reflective (HR) coating disposed on a back side of the active layer;

FIG. 1A is a partial cross sectional view of the makeup of the AR and HR coatings comprising a quarterwave stack of alternating layers of Cadmium-Telluride (CdTe) material and a material formed of a compound having the following formula: $Hg_{0.35}Cd_{0.65}Te$;

FIG. 2 is a cross-sectional view of the infrared radiation detector in a second embodiment illustrating the active layer having the HR coating disposed on both the front and back sides;

DETAILED DESCRIPTION OF THE INVENTION

Figure 3:
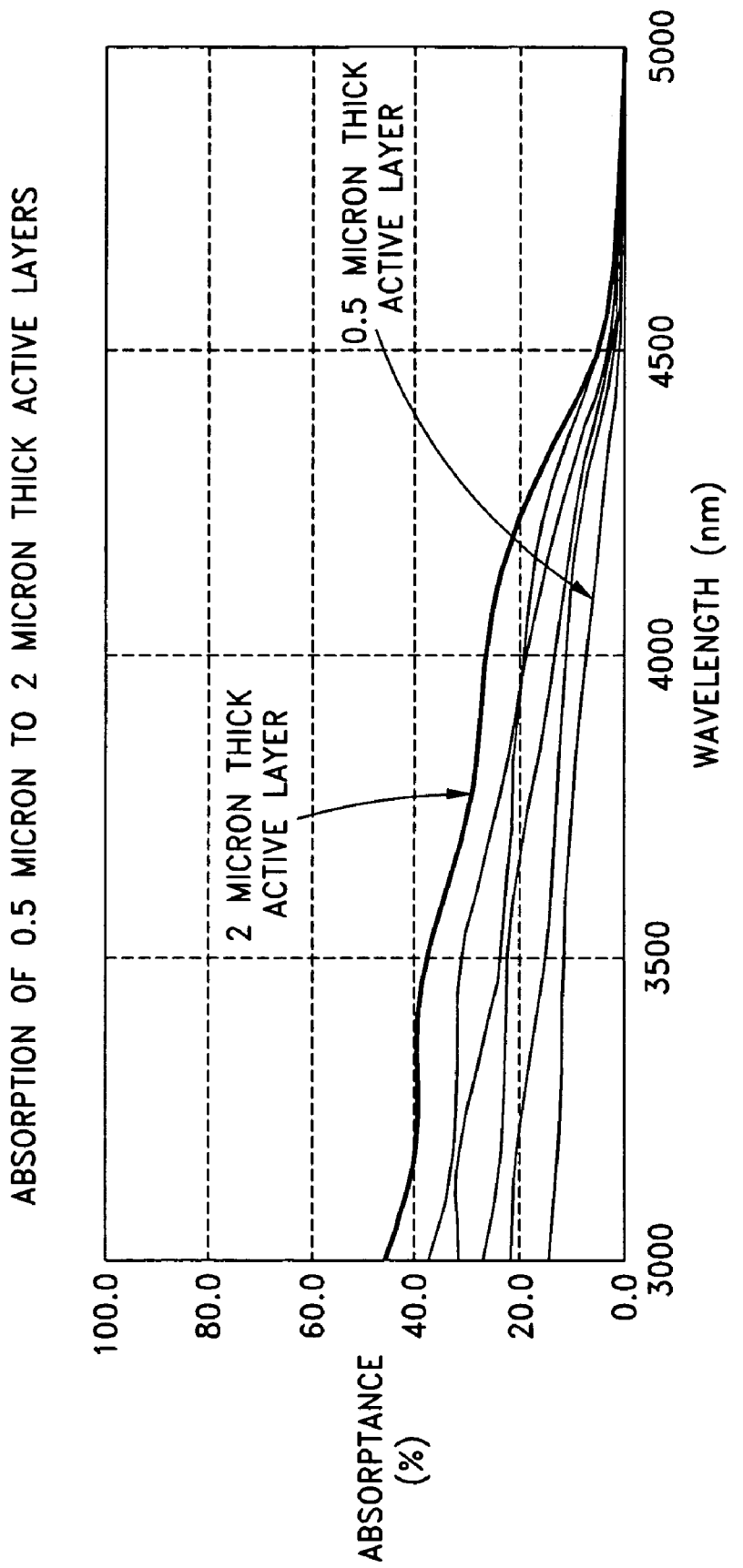
FIG. 3 illustrates several plots of absorptance as a function of wavelength for active layers formed of $Hg_{0.3}Cd_{0.7}Te$ (i.e., 30% material) and having thicknesses ranging from about 0.5 microns to about 2.0 microns.

Referring now to the drawings wherein the showings are for purposes of illustrating the present invention and not for purposes of limiting the same, provided is an infrared (IR) radiation detector 10 comprising an active layer 12 having a front side 14 and a back side 16 with coatings disposed on the front side 14 and back side 16 in order to enhance absorptability within the active layer 12. Advantageously, the specific configurations of the infrared radiation detector 10 allows for increased absorptability into the active layer 12 as well as allowing for spectral selectivity such that objects emitting IR radiation of a known wavelength may be detected.

Absorptability of the active layer 12 may be increased by increasing the thickness of the active layer 12. Unfortunately, increasing the thickness of the active layer 12 results in an increase in the amount of noise that is generated during radiation detection. The embodiments of the present invention shown herein are specifically adapted to increase absorptability into the active layer 12 while minimizing the amount of noise that is generated due to the unique configuration of coatings that may be applied to the front and back sides 14, 16 of the active layer 12.

Shown in FIG. 1 is a first embodiment of the IR radiation detector 10. More specifically, the IR radiation detector 10 of the first embodiment comprises the active layer 12 having the front side 14 and the back side 16 with an anti-reflective (AR) coating 20 being disposed on the front side 14 and highly-reflective (HR) coating 22 being disposed on the back side 16. Such a configuration results in anti-reflective of incident light 18 upon the front side 14 with the back side 16 serving as a mirror.

In this manner, incident light 18 is double-passed through the active layer 12 to increase absorptance thereinto. It should be noted that for the embodiments described herein, the preferable thickness of the active layer 12 is from 0.5 microns to 2.0 microns although the active layer 12 may be provided in any thickness. It is contemplated that the active layer 12 is formed of a compound having the formula $Hg_{0.30}Cd_{0.70}Te$ and which may be referred to herein as 30% material 30.

As shown in FIG. 1, the anti-reflective coating 20 is disposed on the front side 14 and is configured to minimize reflection of incident light 18 within a wavelength band of interest upon the front side 14. Furthermore, the anti-reflective coating 20 is preferably comprised of a quarterwave stack 24 of three layers 26 each having an optical thickness equal to one-fourth of the wavelength band of interest. As is known in the art, a quarterwave stack 24 is comprised of alternating layers 26 of two or more dielectric materials with each layer 26 having an optical thickness corresponding to one-quarter of the wavelength of interest.

Such an anti-reflective coating 20 is known to have a high reflection at the wavelength of interest while simultaneously transmitting wavelengths that are higher and/or lower than the wavelength of interest. Constructive interference of the reflected wavelengths maximizes overall reflectance of the anti-reflective coating 20 while destructive interference among transmitted wavelengths minimizes overall transmissibility. When the anti-reflective coating 20 is applied to the front side 14 of the active layer 12, net transmissibility is increased.

Also shown in FIG. 1 is the highly-reflective coating 22 which is preferably disposed on the back side 16. The highly-reflective coating 22 is preferably configured to increase reflection within the wavelength band of interest at the back side 16. Furthermore, the highly-reflective coating 22 is preferably comprised of a quarterwave stack 24 of a plurality of layers 26 each having an optical thickness equivalent to one-fourth of the wavelength band of interest.

In the first embodiment shown in FIG. 1, the three layers 26 comprising the anti-reflective coating 20 are preferably 0.625 microns thick although the anti-reflective coating 20 may be provided in any thickness. Regarding materials from which the layers 26 of the anti-reflective coating 20 are fabricated, it is contemplated that the layers 26 may alternate between material formed of CdTe (Cadmium-Telluride) and material formed of a compound having the formula $Hg_{0.35}Cd_{0.65}Te$ and referred to herein as 35% material 32. The thickness of the highly-reflective coating 22 is contemplated to be about 0.625 microns although the highly-reflective coating 22 may be provided in any thickness.

As was earlier indicated, the highly-reflective coating 22 that is disposed on the back side 16 of the active layer 12 is comprised of the plurality of layers 26 which are preferably alternately formed of CdTe material 28 and 35% material 32. Furthermore, the full-width at half maximum transmission for the quarterwave stack 24 of the highly-reflective coating 22 is preferably configured to be centered at a wavelength of about 3750 nanometers. The quarterwave stack 24 comprising the highly-reflective coating 22 may include twenty or thirty layers 26 of the highly-reflective coating 22.

FIG. 3 illustrates several plots of absorptance as a function of wavelength or an active layer 12 of thickness of about 0.5 microns wherein the active layer 12 includes or omits the anti-reflective coating 20 and/or the highly-reflective coating 22 on respective front and back sides 14, 16. More specifically, FIG. 3 illustrates the variations in absorptance as a function of wavelength for five different thicknesses of the active layer 12 ranging from about 0.5 microns to about 2.0 microns. As can be seen in FIG. 3, absorptance generally increases in correspondence to an increase in the thickness of the active layer 12.

The refractive index that was used in determining the absorption coefficient of the active layer 12 and, hence, the absorptance of the IR radiation detector was calculated using the equation as follows: $n_{avg}=2.65+1.17(1-X)^2$. Using this equation, a refractive index of 3.22 was obtained for 30% material 30. A refractive index of 3.144 was obtained for 35% material 32. The accuracy of the result of the refractive indices using the above listed equation is typically about ±2%. Absorptance plots shown in FIGS. 3-4 and 6-8 are for the wavelength band of interest within the MWIR range which is in the range from about 3.0 microns to about 5.0 microns. In the plot shown in FIG. 3, approximately 20% to 30% of incident light 18 is reflected at the front side 14 of the active layer 12. The waviness appearing in the plots of absorptance versus the wavelength result from interference effects.

However, by providing the IR radiation detector in the first embodiment wherein the active layer 12 includes the anti-reflective coating 20 on the front side 14 and the highly-reflective coating 22 on the back side 16, increasing the number of layers 26 in the quarterwave stack 24 of the highly-reflective coating 22 on the back side 16 allows for a gain in the absorptance in the active layer 12. Because light can only make two passes in the configuration shown in the first embodiment of FIG. 1, increasing the number of layers 26 of the highly-reflective coating 22 asymptotically approaches a gain of about two times the absorptance. The bandwidth of the gain is limited by the bandwidth of the highly-reflective coating 22 which, in the case of the quarterwave stack 24, is due to the refractive index contrast of the layers 26 used to make the highly-reflective coating 22. In this case, the refractive index contrast is approximately 1.17 for the embodiment illustrated by the plots of FIG. 4.

Figure 4:
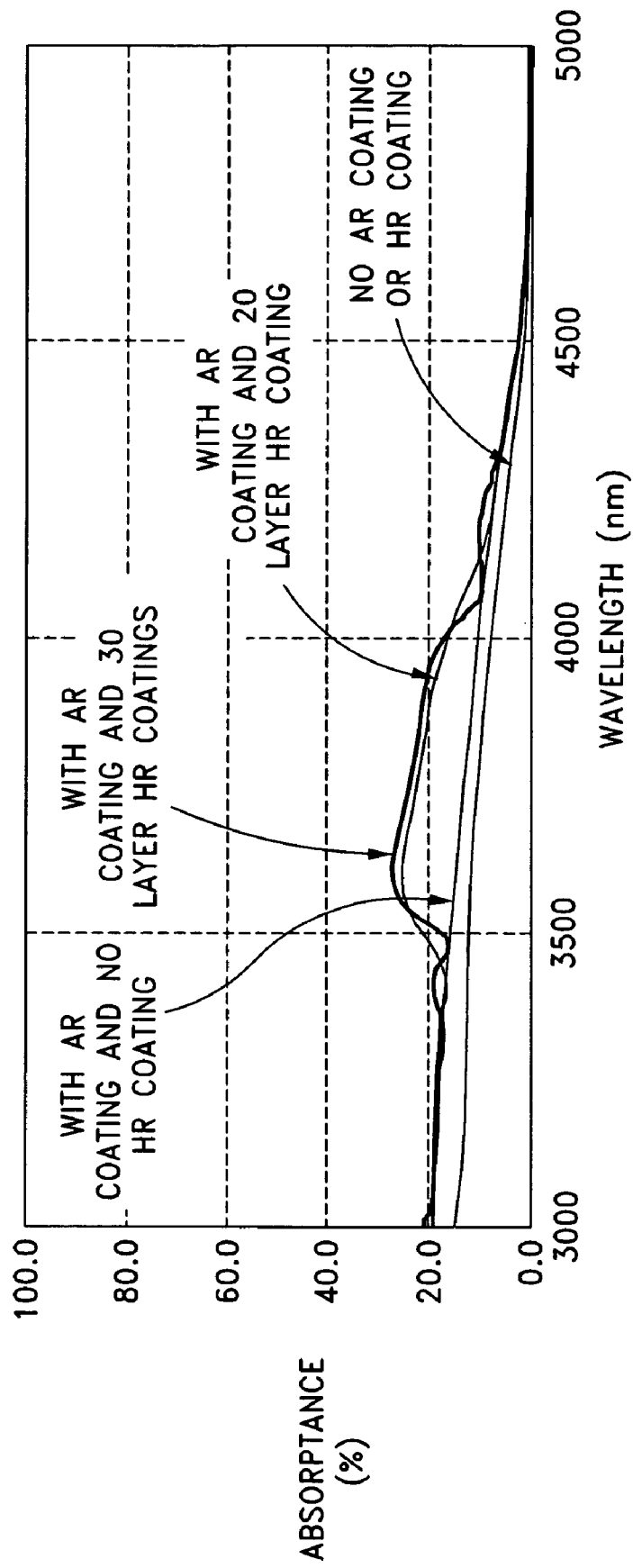
FIG. 4 illustrates several plots of absorptance as a function of wavelength for an active layer thickness of about 0.5 microns with and without the AR and the HR coating on the respective front and back sides and illustrating the increase in absorptance into the active layer for the first embodiment.

As was earlier mentioned, the first embodiment preferably includes the active layer 12 having both the anti-reflective coating 20 and the highly-reflective coating 22 disposed on respective ones of the front and back sides 14, 16 of the active layer 12. FIG. 4 illustrates variations in applications of the anti-reflective coating 20 and the highly-reflective coating 22. More specifically, the plots shown in FIG. 4 are plots of absorptance versus wavelength for the following four cases: (1) no anti-reflective coating 20 and no highly-reflective coating 22, (2) an anti-reflective coating 20 but no highly-reflective coating 22, (3) an anti-reflective coating 20 on the front side 14 and a 20-layer highly-reflective coating 22 on the back side 16, (4) an anti-reflective coating 20 on the front side 14 and a 30-layer highly-reflective coating 22 on the back side 16. As can be seen, absorptance generally improves with the embodiment having the anti-reflective coating 20 on the front side 14 and a 30-layer highly-reflective coating 22 on the back side 16, especially within the band from 3,500 to 4,000 nanometers.

Figure 5:
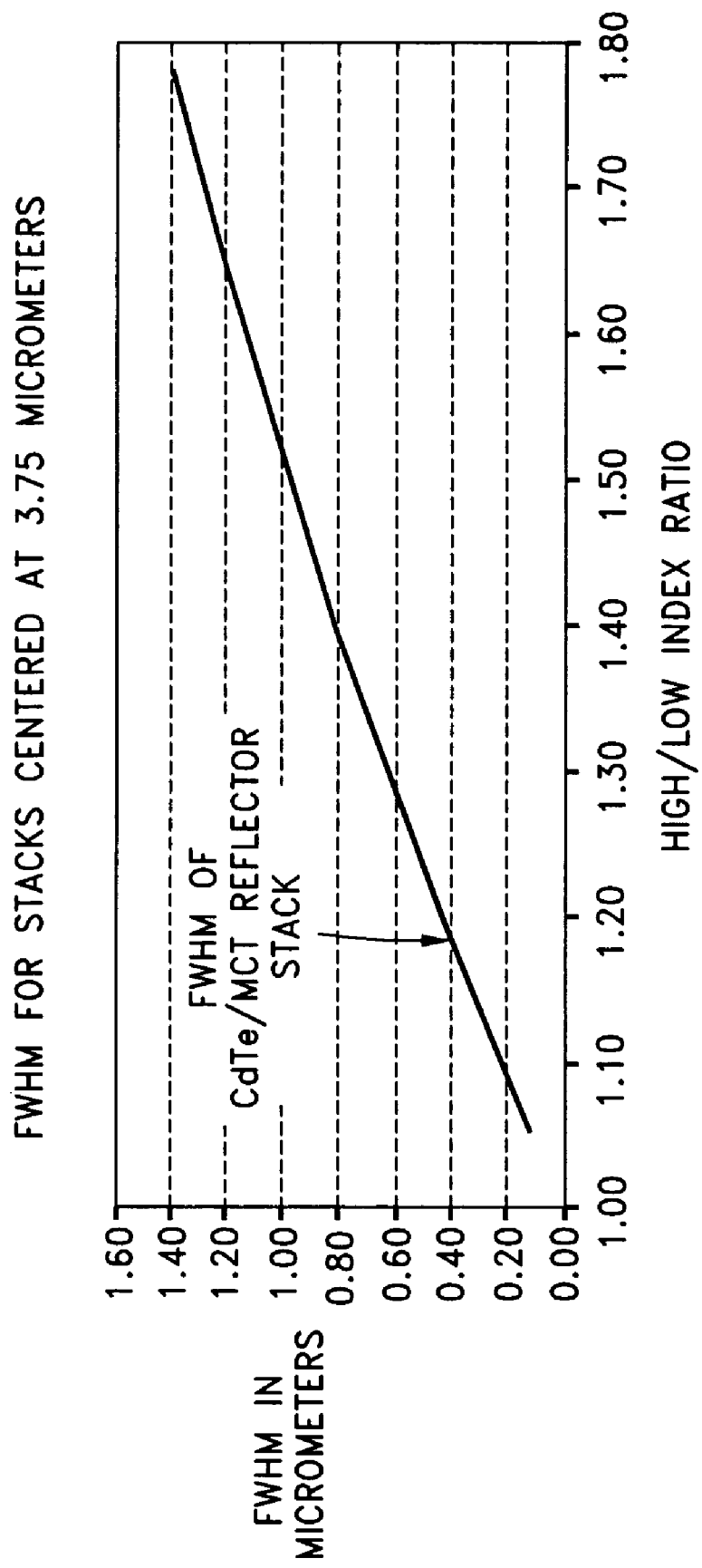
FIG. 5 is a plot of bandwidth as a function of a quarterwave stack refractive index stack ratio for a full-width at half-maximum (FWHM) height transmission centered at about 3.75 microns.

Shown in FIG. 5 is a plot of bandwidth as a function of a quarterwave stack 24 refractive index stack ratio for a full width at half maximum (FWHM) height transmission centered at about 3.75 microns. As can be seen by reference to FIG. 5, by manipulating the refractive index stack ratio, the absorptability of the active layer 12 within a certain bandwidth may be enhanced. For example, referring to FIG. 4, absorptance of the IR radiation detector is enhanced in the bandwidth from 3,500 to 4,000 nanometers wherein the refractive index stack ratio is about 1.17. By changing the refractive index stack ratio, the bandwidth wherein the absorptability of the active layer 12 is enhanced may be shifted.

Figure 6:
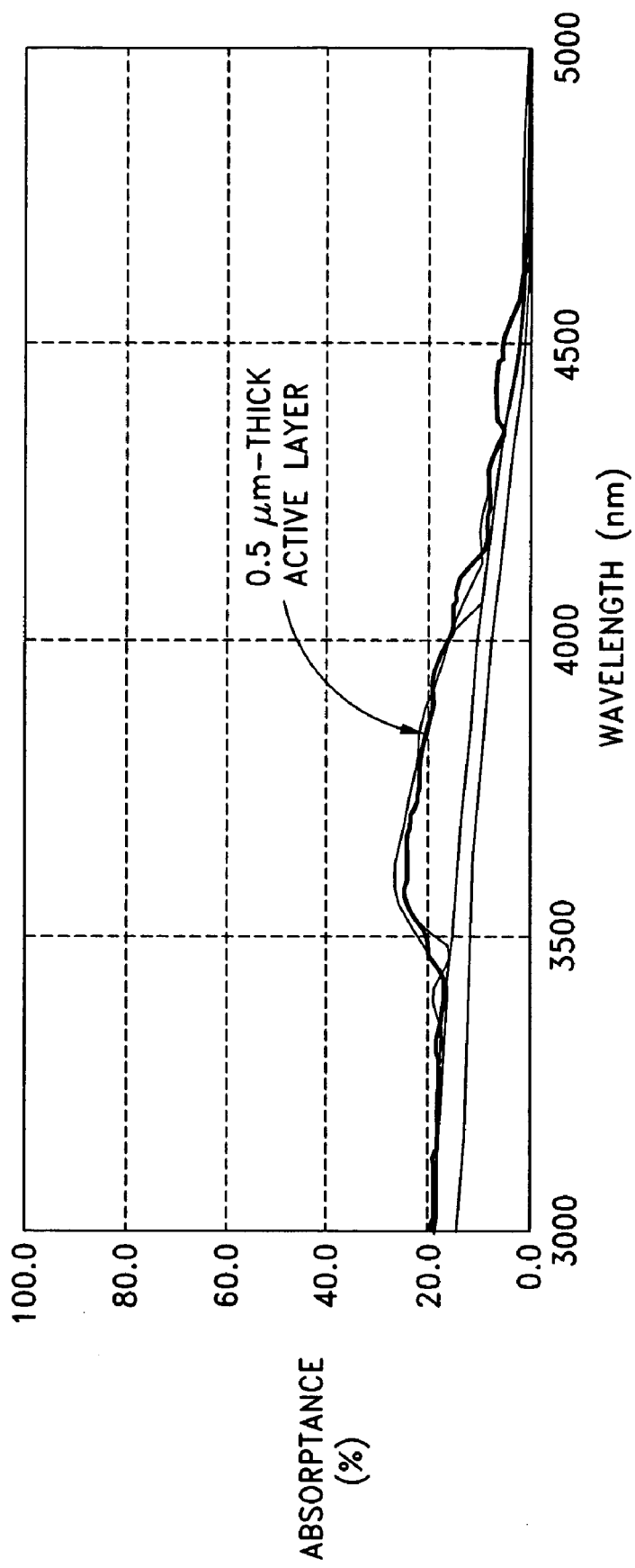
FIG. 6 illustrates several plots of absorptance as a function of wavelength for an active layer having a thickness of about 0.5 microns wherein the HR coating is comprised of layers having overlapping band edges with each layer being centered at different wavelengths such that the band edges are in an absorptance band of the atmosphere.
Figure 7:
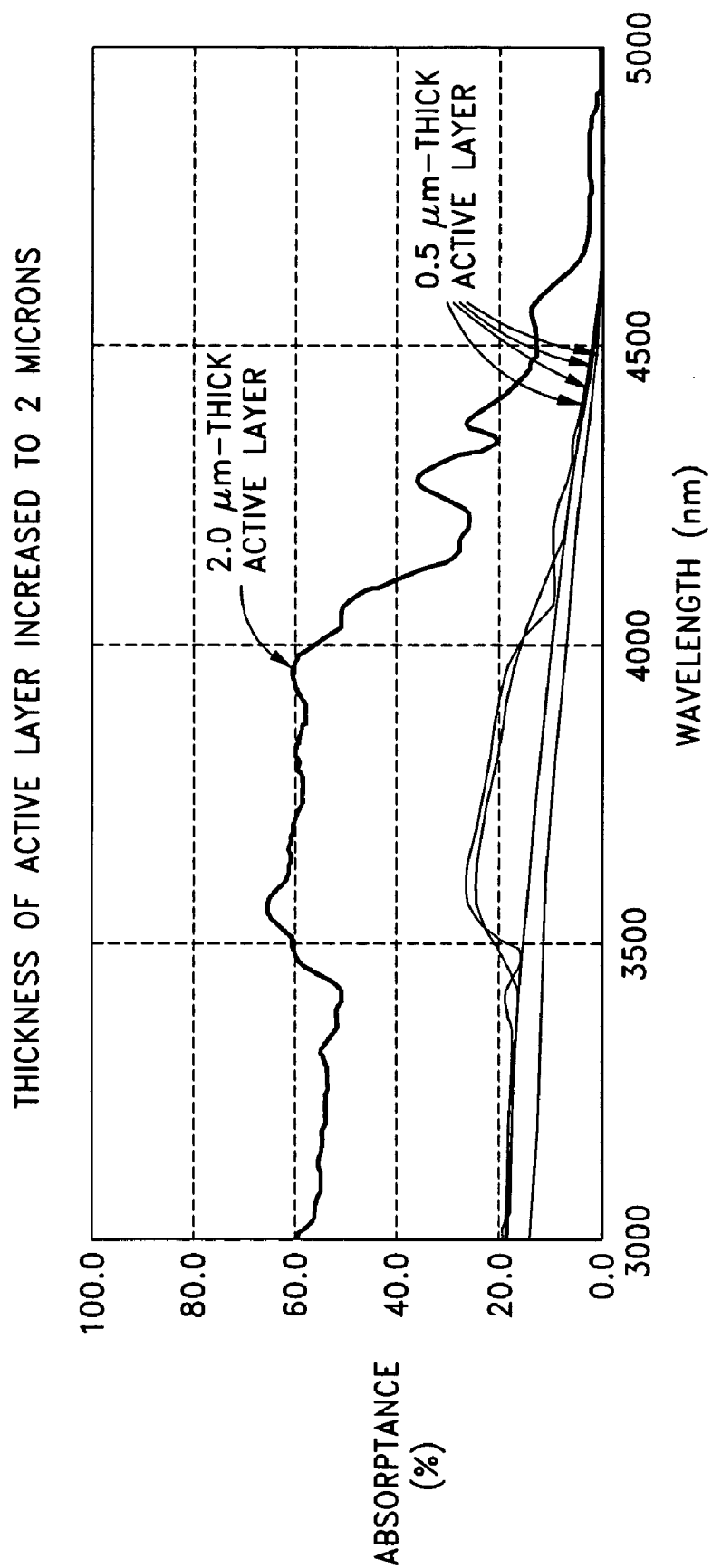
FIG. 7 illustrates several plots of absorptance as a function of wavelength for an active layer thickness of about 0.5 microns as compared to a single plot for an active layer thickness of about 2.0 microns.

FIG. 6 illustrates several plots of absorptance as a function of wave length for an active layer 12 having a thickness of about 0.5 microns. In FIG. 6, the active layer 12 includes the highly-reflective coating 22 which is comprised of layers 26 having overlapping band edges with each layer 26 being centered at different wavelengths such that the band edges are in an absorptance band of the atmosphere. However, it is preferable to impedance match the stacks to avoid low reflectivities where the band edges overlap. It is contemplated that performance of the IR radiation detector may be enhanced by taking advantage of low reflective zones by placing them in atmospheric absorption bands wherein noise may be generated from water vapor or $CO_2$ in the atmosphere during radiation detection.

Referring now to FIG. 2, shown is a cross sectional view of the infrared radiation detector in a second embodiment illustrating the active layer 12 having the highly-reflective coating 22 disposed on both the front and back sides 14, 16. In this regard, it is contemplated that the IR radiation detector of the present invention, as shown in the second embodiment, may have improved performance by placing the active layer 12 in a cavity of a Fabry-Perot etalon (i.e. filter).

By configuring the IR radiation detector as shown in the second embodiment, spectral selectivity is enhanced. More specifically, by configuring the IR radiation detector as shown in the second embodiment, specific wavelength bands may be selectively passed through the front side 14. Field strengths in the cavity of the Fabry-Perot filter may be increased up to many times that of the incident field and can therefore more effectively interact with the active layer 12. Such a configuration results in a narrowband response, as was earlier mentioned, which advantageously combines filtering properties directly into the IR radiation detector.

Referring now more specifically to FIG. 2, shown is the IR radiation detector in the second embodiment which comprises the active layer 12 having the front side 14 and the back side 16 with highly-reflective coatings 22 disposed on each of the front and back sides 14, 16. The highly-reflective coating 22 disposed on the front side 14 is specifically configured to increase reflection of incident light 18 falling outside of a wavelength band of interest while minimizing reflection of incident light 18 falling within the wavelength band of interest. Furthermore, the highly-reflective coating 22 is preferably comprised of a quarterwave stack 24 of a plurality of layers 26 each having an optical thickness equivalent to one-fourth of the wavelength band of interest.

Likewise, a highly-reflective coating 22 is disposed on the back side 16 and is configured to increase the reflection of the wavelength band of interest upon the back side 16. The highly-reflective coating 22 on the back side 16 is also comprised of a quarterwave stack 24 of a plurality of layers 26 each having an optical thickness equivalent to one-fourth of the wavelength band of interest. As was earlier mentioned, the infrared detector of the present invention may be installed in a cavity of a Fabry-Perot etalon. The active layer 12 may have a thickness in the range of from about 0.5 microns to about 2.0 microns although the active layer 12 may be provided in any thickness.

Preferably, the thickness is specifically configured to be complementary to the wavelength band of interest such that absorptance into the active layer 12 is maximized. For example, it is contemplated that the active layer 12 may be optimized to provide about 90% absorptance for a wavelength band of interest in the range of from about 3,650 nanometers to about 3,850 nanometers. The thickness of the highly-reflective coating 22 on the front side 14 may be about 0.625 microns although the highly-reflective coating 22 may be provided in any thickness.

As was earlier mentioned, for the IR radiation detector of the first embodiment, the active layer 12 of the second embodiment may be formed of 30% material 30. The thickness of the highly-reflective coating 22 on the back side 16 is contemplated to be about 0.625 microns thick although the thickness of the highly-reflective coating 22 may be of any thickness. The plurality of layers 26 of the highly-reflective coatings 22 may be alternatively formed of CdTe and 35% material 32. Furthermore, the full width at half maximum transmission for the quarterwave stack 24 of the highly-reflective coatings 22 is preferably centered at a wavelength of about 3,750 nanometers.

Figure 8:
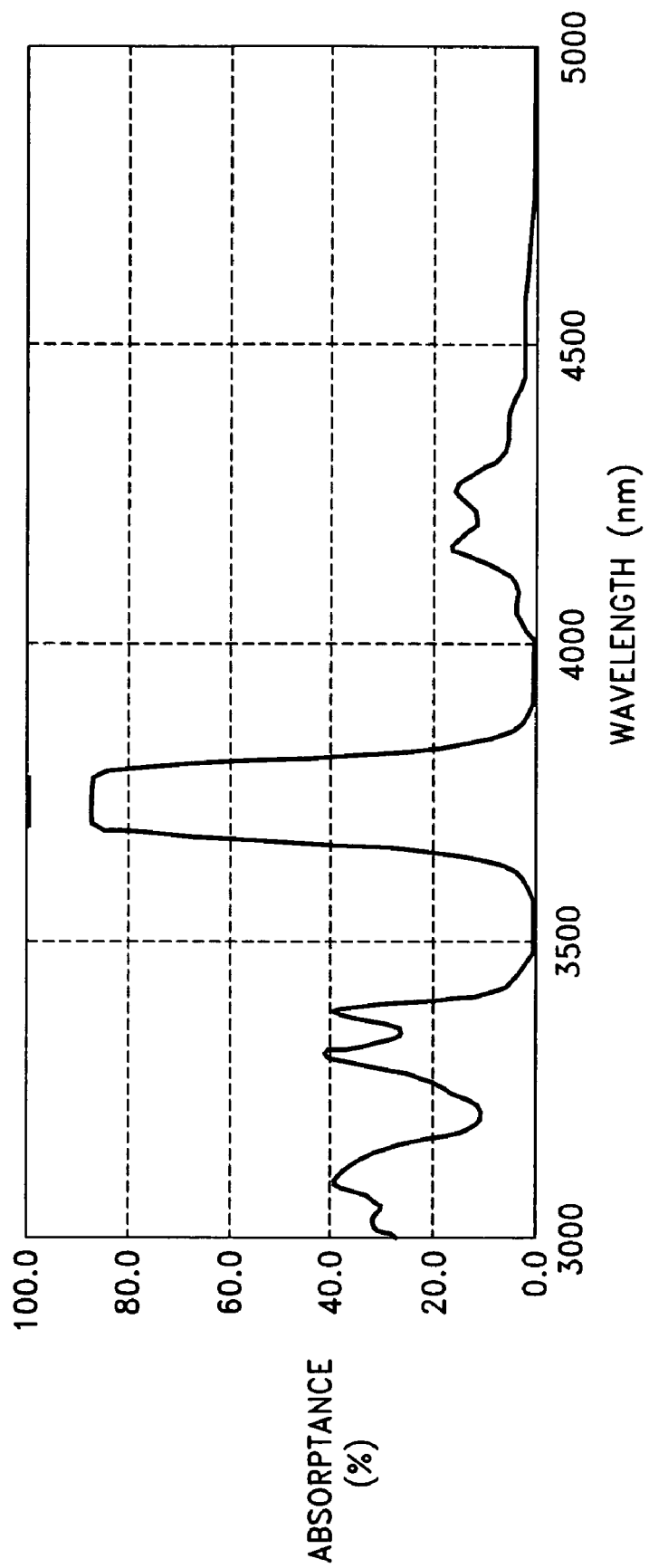
FIG. 8 illustrates several plots of absorptance as a function of wavelength for a 0.5 micron thick active layer for the second embodiment and wherein the active layer thickness is optimized to provide peak performance with the FWHM height transmission being in the range of from about 3.65 microns to about 3.85 microns.

Referring now to FIG. 8, illustrated are several plots of absorptance as a function of wavelength for a 0.5 micron thick active layer 12 for the second embodiment of the IR radiation detector. In the second embodiment, the active layer 12 thickness is preferably optimized to provide peak performance for the full width and half maximum (FWHM) height transmission in the range of from about 3.65 microns to about 3.85 microns. As shown in FIG. 8, absorptance increases on the order of from about 4.5 times absorptance of a double-pass embodiment as shown in FIG. 1 (i.e., the first embodiment of the IR radiation detector).

As can be seen in FIG. 8, the bandwidth for which absorptance is increased is relatively narrow compared to the bandwidth for the first embodiment as is shown in FIG. 4. It should be noted, however, that for the second embodiment, the thickness of the active layer 12 may be increased in order to improve the absorptance of the IR radiation detector. However, the highly-reflective coatings 22 on the front side 14 and the back side 16 of the active layer 12 must be re-optimized in order to complement the new thickness of the active layer 12.

Additional modifications and improvements of the present invention may also be apparent to those of ordinary skill in the art. Thus, the particular combination of parts described and illustrated herein is intended to represent only certain embodiments of the present invention, and is not intended to serve as limitations of alternative devices within the spirit and scope of the invention.

What is claimed is:

1. An infrared radiation detector, comprising:
an active layer having a front side and a back side and being formed of a Mercury-Cadmium-Telluride material system;
an anti-reflective coating disposed on the front side and formed of a Mercury-Cadmium-Telluride material system and being configured to minimize reflection of incident light within a wavelength band of interest upon the front side, the anti-reflective coating being comprised of a quarterwave stack of three layers each having an optical thickness equivalent to one-fourth of the wavelength band of interest; and
a highly-reflective coating disposed on the back side and formed of a Mercury-Cadmium-Telluride material system and being configured to increase reflection within the wavelength band of interest upon the back side, the highly-reflective coating being comprised of a quarterwave stack of a plurality of layers each having an optical thickness equivalent to one-fourth of the wavelength band of interest.

2. An infrared radiation detector, comprising:
an active layer having a front side and a back side;
an anti-reflective coating disposed on the front side and being configured to minimize reflection of incident light within a wavelength band of interest upon the front side, the anti-reflective coating being comprised of a quarterwave stack of three layers each having an optical thickness equivalent to one-fourth of the wavelength band of interest; and
a highly-reflective coating disposed on the back side and being configured to increase reflection within the wavelength band of interest upon the back side, the highly-reflective coating being comprised of a quarterwave stack of a plurality of layers each having an optical thickness equivalent to one-fourth of the wavelength band of interest;
wherein the wavelength band of interest is in the range of from about 3.0 to about 5.0 microns.

3. An infrared radiation detector, comprising:
an active layer having a front side and a back side; an anti-reflective coating disposed on the front side and being configured to minimize reflection of incident light within a wavelength band of interest upon the front side, the anti-reflective coating being comprised of a quarterwave stack of three layers each having an optical thickness equivalent to one-fourth of the wavelength band of interest; and
a highly-reflective coating disposed on the back side and being configured to increase reflection within the wavelength band of interest upon the back side, the highly-reflective coating being comprised of a quarterwave stack of a plurality of layers each having an optical thickness equivalent to one-fourth of the wavelength band of interest;
wherein the active layer has a thickness in the range of from about 0.5 microns to about 2.0 microns.

4. An infrared radiation detector, comprising:
an active layer having a front side and a back side;
an anti-reflective coating disposed on the front side and being configured to minimize reflection of incident light within a wavelength band of interest upon the front side, the anti-reflective coating being comprised of a quarterwave stack of three layers each having an optical thickness equivalent to one-fourth of the wavelength band of interest; and
a highly-reflective coating disposed on the back side and being configured to increase reflection within the wavelength band of interest upon the back side, the highly-reflective coating being comprised of a quarterwave stack of a plurality of layers each having an optical thickness equivalent to one-fourth of the wavelength band of interest;
wherein the active layer is formed of a compound having the following formula: $Hg_{0.3}Cd_{0.7}Te$.

5. An infrared radiation detector, comprising:
an active layer having a front side and a back side; an anti-reflective coating disposed on the front side and being configured to minimize reflection of incident light within a wavelength band of interest upon the front side, the anti-reflective coating being comprised of a quarterwave stack of three layers each having an optical thickness equivalent to one-fourth of the wavelength band of interest; and a highly-reflective coating disposed on the back side and being configured to increase reflection within the wavelength band of interest upon the back side, the highly-reflective coating being comprised of a quarterwave stack of a plurality of layers each having an optical thickness equivalent to one-fourth of the wavelength band of interest;

wherein the thickness of the anti-reflective coating is about 0.625 microns.

6. An infrared radiation detector, comprising:

an active layer having a front side and a back side;

an anti-reflective coating disposed on the front side and being configured to minimize reflection of incident light within a wavelength band of interest upon the front side, the anti-reflective coating being comprised of a quarterwave stack of three layers each having an optical thickness equivalent to one-fourth of the wavelength band of interest; and a highly-reflective coating disposed on the back side and being configured to increase reflection within the wavelength band of interest upon the back side, the highly-reflective coating being comprised of a quarterwave stack of a plurality of layers each having an optical thickness equivalent to one-fourth of the wavelength band of interest;

wherein the layers of the anti-reflective coating alternate between material formed of CdTe and material formed of a compound having the following formula: $Hg_{0.35}Cd_{0.65}Te$.

7. An infrared radiation detector, comprising:

an active layer having a front side and a back side;

an anti-reflective coating disposed on the front side and being configured to minimize reflection of incident light within a wavelength band of interest upon the front side, the anti-reflective coating being comprised of a quarterwave stack of three layers each having an optical thickness equivalent to one-fourth of the wavelength band of interest; and a highly-reflective coating disposed on the back side and being configured to increase reflection within the wavelength band of interest upon the back side, the highly-reflective coating being comprised of a quarterwave stack of a plurality of layers each having an optical thickness equivalent to one-fourth of the wavelength band of interest;

wherein the thickness of the highly-reflective coating is about 0.625 microns.

8. An infrared radiation detector, comprising:

an active layer having a front side and a back side;

an anti-reflective coating disposed on the front side and being configured to minimize reflection of incident light within a wavelength band of interest upon the front side, the anti-reflective coating being comprised of a quarterwave stack of three layers each having an optical thickness equivalent to one-fourth of the wavelength band of interest; and a highly-reflective coating disposed on the back side and being configured to increase reflection within the wavelength band of interest upon the back side, the highly-reflective coating being comprised of a quarterwave stack of a plurality of layers each having an optical thickness equivalent to one-fourth of the wavelength band of interest;

wherein:

the plurality of layers of the highly-reflective coating being alternately formed of CdTe material and a material formed of a compound having the following formula: $Hg_{0.35}Cd_{0.65}Te$;

the full-width at half maximum transmission for the quarterwave stack of the highly-reflective coating being centered at a wavelength of about 3750 nanometers.

9. An infrared radiation detector, comprising:

an active layer having a front side and a back side;

an anti-reflective coating disposed on the front side and being configured to minimize reflection of incident light within a wavelength band of interest upon the front side, the anti-reflective coating being comprised of a quarterwave stack of three layers each having an optical thickness equivalent to one-fourth of the wavelength band of interest; and a highly-reflective coating disposed on the back side and being configured to increase reflection within the wavelength band of interest upon the back side, the highly-reflective coating being comprised of a quarterwave stack of a plurality of layers each having an optical thickness equivalent to one-fourth of the wavelength band of interest;

wherein the quarterwave stack comprises 20 layers.

10. An infrared radiation detector, comprising:

an active layer having a front side and a back side;

an anti-reflective coating disposed on the front side and being configured to minimize reflection of incident light within a wavelength band of interest upon the front side, the anti-reflective coating being comprised of a quarterwave stack of three layers each having an optical thickness equivalent to one-fourth of the wavelength band of interest; and a highly-reflective coating disposed on the back side and being configured to increase reflection within the wavelength band of interest upon the back side, the highly-reflective coating being comprised of a quarterwave stack of a plurality of layers each having an optical thickness equivalent to one-fourth of the wavelength band of interest;

wherein the quarterwave stack comprises 30 layers.

11. An infrared radiation detector, comprising:

an active layer having a front side and a back side and being formed of a Mercury-Cadmium-Telluride material system;

a highly-reflective coating disposed on the front side and formed of a Mercury-Cadmium-Telluride material system and being configured to increase reflection of incident light falling outside of a wavelength band of interest and minimize reflection of incident light falling within the wavelength band of interest, the highly-reflective coating being comprised of a quarterwave stack of a plurality of layers each having an optical thickness equivalent to one-fourth of the wavelength band of interest; and a highly-reflective coating disposed on the back side and formed of a Mercury-Cadmium-Telluride material system and being configured to increase reflection of the wavelength band of interest upon the back side, the highly-reflective coating being comprised of a quarter-wave stack of a plurality of layers each having an optical thickness equivalent to one-fourth of the wavelength band of interest.

12. The detector of claim 11 wherein the infrared detector is installed in a cavity of a Fabry-Perot etalon.

13. The infrared detector of claim 12 wherein the active layer is optimized to provide about 90 percent absorptance for a wavelength band of interest in the range of from about 3650 nanometers to about 3850 nanometers.

14. An infrared radiation detector, comprising:
an active layer having a front side and a back side;
a highly-reflective coating disposed on the front side and being configured to increase reflection of incident light falling outside of a wavelength band of interest and minimize reflection of incident light falling within the wavelength band of interest, the highly-reflective coating being comprised of a quarterwave stack of a plurality of layers each having an optical thickness equivalent to one-fourth of the wavelength band of interest; and
a highly-reflective coating disposed on the back side and being configured to increase reflection of the wavelength band of interest upon the back side, the highly-reflective coating being comprised of a quarterwave stack of a plurality of layers each having an optical thickness equivalent to one-fourth of the wavelength band of interest;
wherein:
the active layer has a thickness in the range of from about 0.5 microns to about 2.0 microns;
the thickness being configured complementary to the wavelength band of interest such that absorptance into the active layer is maximized.

15. An infrared radiation detector, comprising:
an active layer having a front side and a back side;
a highly-reflective coating disposed on the front side and being configured to increase reflection of incident light falling outside of a wavelength band of interest and minimize reflection of incident light falling within the wavelength band of interest, the highly-reflective coating being comprised of a quarterwave stack of a plurality of layers each having an optical thickness equivalent to one-fourth of the wavelength band of interest; and
a highly-reflective coating disposed on the back side and being configured to increase reflection of the wavelength band of interest upon the back side, the highly-reflective coating being comprised of a quarterwave stack of a plurality of layers each having an optical thickness equivalent to one-fourth of the wavelength band of interest;
wherein the thickness of the highly-reflective coating on the front side is about 0.625 microns.

16. An infrared radiation detector, comprising:
an active layer having a front side and a back side;
a highly-reflective coating disposed on the front side and being configured to increase reflection of incident light falling outside of a wavelength band of interest and minimize reflection of incident light falling within the wavelength band of interest, the highly-reflective coating being comprised of a quarterwave stack of a plurality of layers each having an optical thickness equivalent to one-fourth of the wavelength band of interest; and
a highly-reflective coating disposed on the back side and being configured to increase reflection of the wavelength band of interest upon the back side, the highly-reflective coating being comprised of a quarterwave stack of a plurality of layers each having an optical thickness equivalent to one-fourth of the wavelength band of interest;
wherein the thickness of the highly-reflective coating on the back side is about 0.625 microns.

17. An infrared radiation detector, comprising:
an active layer having a front side and a back side;
a highly-reflective coating disposed on the front side and being configured to increase reflection of incident light falling outside of a wavelength band of interest and minimize reflection of incident light falling within the wavelength band of interest, the highly-reflective coating being comprised of a quarterwave stack of a plurality of layers each having an optical thickness equivalent to one-fourth of the wavelength band of interest; and
a highly-reflective coating disposed on the back side and being configured to increase reflection of the wavelength band of interest upon the back side, the highly-reflective coating being comprised of a quarterwave stack of a plurality of layers each having an optical thickness equivalent to one-fourth of the wavelength band of interest;
wherein the active layer is formed of a compound having the following formula: $Hg_{0.3}Cd_{0.7}Te$.

18. An infrared radiation detector, comprising:
an active layer having a front side and a back side;
a highly-reflective coating disposed on the front side and being configured to increase reflection of incident light falling outside of a wavelength band of interest and minimize reflection of incident light falling within the wavelength band of interest, the highly-reflective coating being comprised of a quarterwave stack of a plurality of layers each having an optical thickness equivalent to one-fourth of the wavelength band of interest; and
a highly-reflective coating disposed on the back side and being configured to increase reflection of the wavelength band of interest upon the back side, the highly-reflective coating being comprised of a quarterwave stack of a plurality of layers each having an optical thickness equivalent to one-fourth of the wavelength band of interest;
wherein:
the plurality of layers of the highly-reflective coatings are alternately formed of CdTe material and a material formed of a compound having the following formula: $Hg_{0.35}Cd_{0.65}Te$;
the full-width at half maximum transmission for the quarterwave stack of the highly-reflective coatings being centered at a wavelength of about 3750 nanometers.

* * * * *